United States Patent [19]
Aiello et al.

[11] Patent Number: 5,914,522
[45] Date of Patent: Jun. 22, 1999

[54] POWER SEMICONDUCTOR STRUCTURE WITH LATERAL TRANSISTOR DRIVEN BY VERTICAL TRANSISTOR

[75] Inventors: Natale Aiello; Davide Patti, both of Catania; Salvatore Leonardi, Aci Sant'Antonio; Salvatore Scaccianoce, Riposto, all of Italy

[73] Assignee: Co.Ri.M.Me-Consorzio per la Ricerca sulla Microelettronica nel Mezzogiorno, Italy

[21] Appl. No.: 08/859,024

[22] Filed: May 20, 1997

[51] Int. Cl.$^6$ .......................... H01L 29/00; H01L 27/082; H01L 27/102
[52] U.S. Cl. .......................... 257/500; 257/557; 257/578
[58] Field of Search .................. 257/499, 500, 257/501, 502, 378

[56] References Cited

U.S. PATENT DOCUMENTS

| | | | |
|---|---|---|---|
| 3,596,115 | 7/1971 | Conzelmann | 307/303 |
| 3,713,908 | 1/1973 | Agusta et al. | 148/175 |
| 4,395,812 | 8/1983 | Bergeron et al. | 29/571 |
| 5,289,028 | 2/1994 | Clark et al. | 257/355 |
| 5,521,414 | 5/1996 | Palara | 257/502 |
| 5,525,826 | 6/1996 | Palara | 257/500 |
| 5,602,416 | 2/1997 | Zambrano | 257/500 |

FOREIGN PATENT DOCUMENTS

| | | |
|---|---|---|
| 2 321 426 | 11/1974 | Germany. |
| 3 247 066 | 6/1984 | Germany. |
| 62-136 872 | 6/1987 | Japan. |

OTHER PUBLICATIONS

"TTL Circuit with Improved Noise Margin," *IBM Technical Disclosure Bulletin*, vol. 19, No. 1, pp. 142–143, Jun. 1976.
"Semconductor Devices Physics and Technology"; S. M. Sze 1985; pp. 110–111.

*Primary Examiner*—Wael M. Fahmy
*Attorney, Agent, or Firm*—Jenkens & Gilchrist, P.C.

[57] ABSTRACT

A power semiconductor structure (200), in particular in VIPower technology, made from a chip of N-type semiconductor material (110), comprising a bipolar or field-effect vertical power transistor (125, 120, 110) having a collector or drain region in such N-type material (110); the semiconductor structure comprises a PNP bipolar lateral power transistor (210, 110, 220) having a base region in such N-type material (110) substantially in common with the collector or drain region of the vertical power transistor.

17 Claims, 6 Drawing Sheets

FIG. 5

POWER SEMICONDUCTOR STRUCTURE WITH LATERAL TRANSISTOR DRIVEN BY VERTICAL TRANSISTOR

BACKGROUND OF THE INVENTION

1. Technical Field

The present invention relates to semiconductor structures and, in a particular but non-limiting manner, to power semiconductor structures.

2. Prior Art

In the technology of mixed-type (signal and power) integrated circuits, both the control or signal processing circuits as well as the power devices capable of driving loads at high voltage and/or heavy current are integrated on the same chip of semiconductor material; typically, in a power device the voltage takes values of between 100 V and 1000 V, whilst the current varies from a few hundred mA to a few A.

Figure 1:
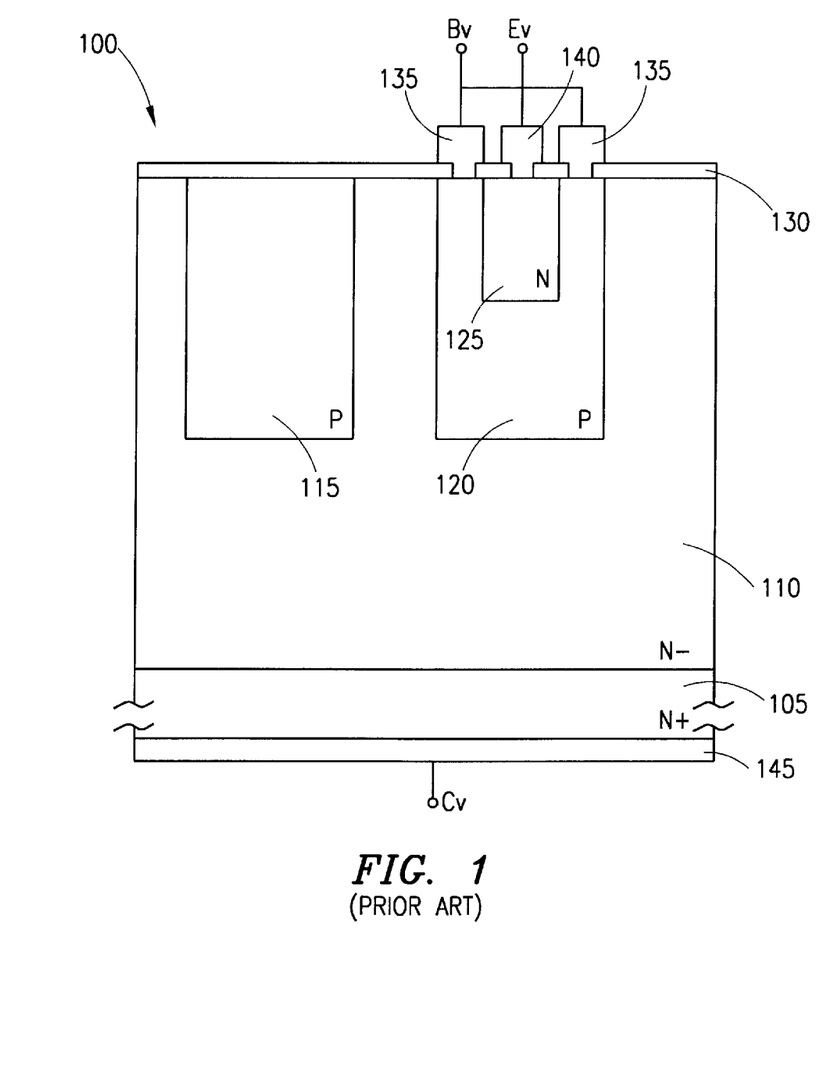
FIG. 1 shows schematically and in cross-section part of a known power semiconductor structure comprising an NPN vertical bipolar power transistor.

An example of such a prior art semiconductor structure comprising an NPN vertical bipolar power transistor is illustrated in FIG. 1. As usual, the concentrations of the N and P type impurities are indicated by adding the sign + or the sign – to the letters N and P to indicate, respectively, a high or low concentration of impurity; the letters N and P without the addition of signs + or – denote concentrations of intermediate value.

The Figure illustrates in cross-section part of a chip 100 of semiconductor material comprising a substrate 105 of monocrystalline silicon strongly doped with N-type impurities (N+) on which is formed an epitaxial layer 110 with the same conductivity type but with a low concentration of impurities (N–). An insulation region 115 of P type having a concentration of impurity of intermediate value (P) is formed in the epitaxial layer 110; such an insulation region 115 delimits N type wells, not represented, inside which are made the signal transistors (not shown in the Figure) able to embody the control circuitry. In the epitaxial layer 110 is a base region 120 of an NPN vertical power transistor doped with P type impurities. Inside the base region 120 there is an emitter region 125 doped with N type impurities.

On the front surface of the chip 100, which is coated with an insulating layer 130, lie metal tracks which are in contact with surface zones of the chip 100; in particular, the metal track 135 is in contact with the base region 120 and the metal track 140 is in contact with the emitter region 125 to form, respectively, the base electrode (or terminal) (Bv) and emitter electrode (or terminal) (Ev) of the NPN vertical power transistor. On the bottom of the chip 100 is a metal layer 145 which constitutes the collector electrode (Cv) of the said power transistor.

Such a structure is commonly used in applications of the "low side driver" type, in which the emitter terminal (Ev) of the NPN power transistor is connected to a reference terminal (earth) which is connected to the negative terminal of a power supply, whilst the collector terminal (Cv) is connected to the first terminal of a load; the second terminal of the load is connected to the positive terminal of the supply (Vcc).

The above-described prior art structure presents drawbacks in the case in which it is necessary to make a PNP type power transistor. A PNP power transistor is commonly used in applications of the "high side driver" type, in which the load is referred to the earth terminal; in particular, the emitter terminal of the PNP power transistor is connected to the positive terminal of the supply, whereas the collector terminal drives a load having the other terminal connected to the earth terminal.

The integrated circuits known in the art which can be used in such configurations have a limited field of application insofar as the maximum voltage which can be applied to the power device is in general less than 100 V.

In particular, a lateral type PNP power transistor made using the normal phases of production of the above-described power semiconductor structure offers limited gain which is insufficient for many types of applications.

Such a PNP lateral power transistor would moreover require dedicated control circuitry comprising at least one driver transistor having its collector connected, via surface metal contacts, to the substrate of the integrated circuit, i.e. to the region in which the base of the PNP lateral power transistor is formed; such dedicated control circuitry would be made in a suitable insulated well, with a consequent wastage of chip area.

Finally, note that driving the PNP lateral power transistor with a transistor of the control zone gives a limitation in the value of the supply voltage which can be applied on account of the modest voltage rating of signal transistors.

Such drawbacks of the known art are avoided by the invention as claimed.

SUMMARY OF THE INVENTION

The present invention makes available a power semiconductor structure made from a chip of N type semiconductor material having a first and a second mutually opposing surface, the said power semiconductor structure comprising a vertical power transistor having a charge gathering region in the said N type material and a charge gathering electrode consisting of conductive means on the said first surface in contact with the said N type material, characterized in that it includes a PNP bipolar lateral power transistor having an emitter region and a collector region consisting, respectively, of a first and of a second P-type region extending from the said second surface to the inside of the said N-type material and having a base region in the said N-type material substantially in common with the said charge gathering region.

Such a structure makes it possible to produce a PNP lateral power transistor having a high breakdown voltage, typically greater than 200 V; experimental tests have moreover revealed that such a PNP lateral transistor is able to support high voltage values although having a low series resistance under saturation conditions and hence a low saturation voltage.

Since the PNP lateral power transistor is driven by a power transistor, the total gain of the device is given by the product of the gains of the two power transistors; such a solution makes it possible furthermore to use a supply voltage of high value.

Note that the PNP lateral power transistor has its base region in common with the charge gathering region (collector or drain) of the vertical power transistor; this makes it possible to integrate the entire power structure compactly into a relatively modest area of the chip.

BRIEF DESCRIPTION OF THE DRAWINGS

Various embodiments of the present invention will now be described by means of examples, with reference to the appended drawings in which:

FIG. 2b illustrates the equivalent circuit of the structure of FIG. 2a;

FIG. 4b shows the equivalent circuit of the structure of FIG. 4a; and

DETAILED DESCRIPTION OF A PREFERRED EMBODIMENT OF THE INVENTION

Figure 2A:
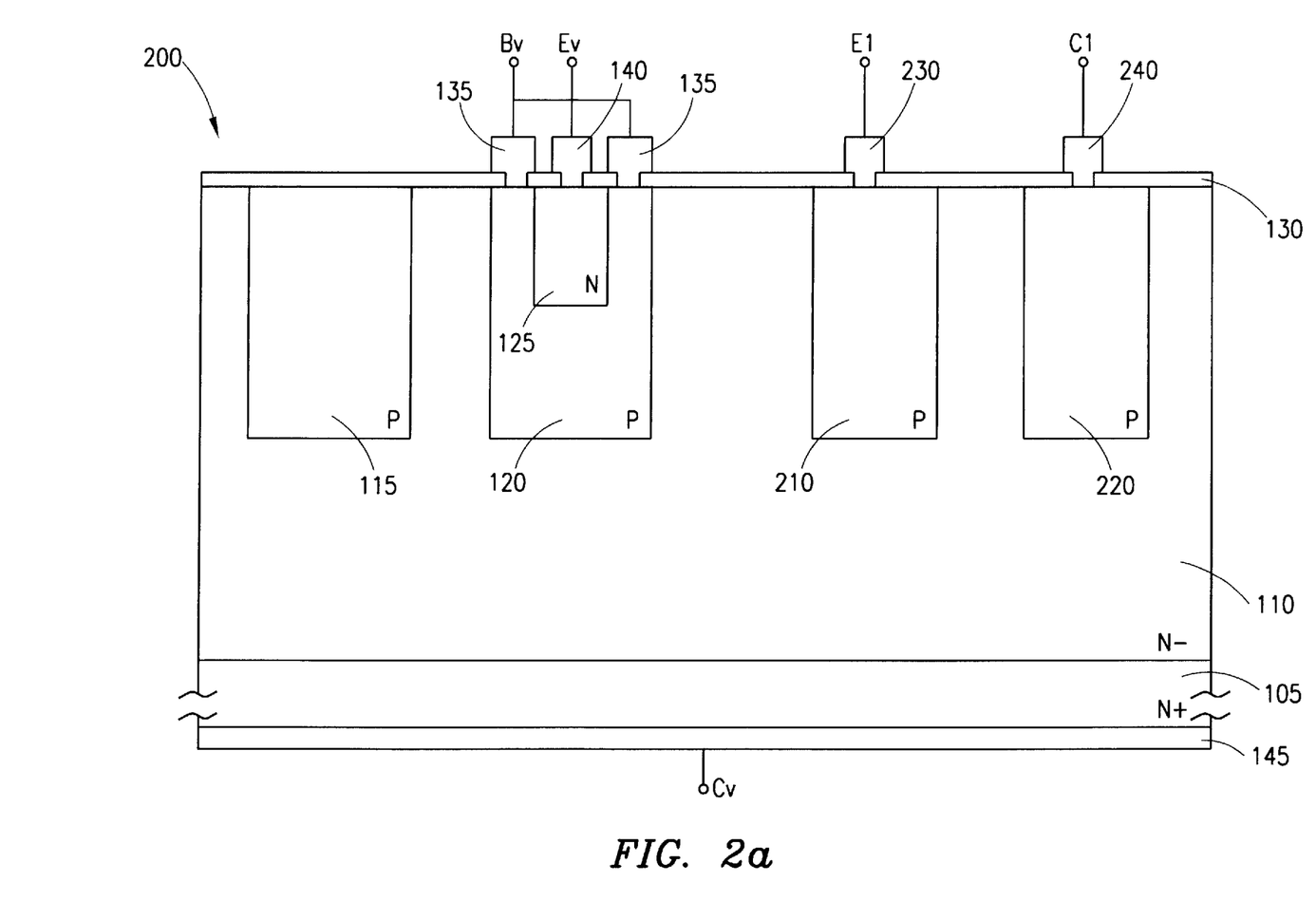
FIG. 2a shows in diagrammatic form a first embodiment of the power semiconductor structure in accordance with the present invention.

With reference now to the Figures, and in particular with reference to FIG. 2a (FIG. 1 was described earlier), there is illustrated in diagrammatic form a first embodiment of the power semiconductor structure in accordance with the present invention. For simplicity of description, in what follows reference will always be made to a device made on a substrate and an epitaxial layer doped with N type impurities, with the consequent production of a PNP type lateral transistor; dual considerations are applicable on substituting the N type regions with corresponding P type regions and vice versa.

FIG. 2a illustrates a chip 200 of semiconductor material comprising, in similar fashion to that described earlier, a substrate 105 of type N+ on which is formed an epitaxial layer 110 of type N−. In the epitaxial layer 110 there is an insulation region 115 of type P which delimits wells of type N, not represented, inside which is made a control circuitry (not shown in the Figure). In the epitaxial layer 110 there is a P type region 120 which constitutes the base region of the NPN vertical power transistor; inside the base region 120 is an emitter region 125 of type N of the same transistor.

On the front surface of the chip 200, coated with the insulating layer 130, lies a metal track 135 in contact with the base region 120 and a metal track 140 in contact with the emitter region 125, which form, respectively, a base electrode (Bv) and an emitter electrode (Ev) of the NPN vertical power transistor. On the bottom of the chip 100 is a metal layer 145 which constitutes the collector electrode (Cv) of the said NPN vertical power transistor. Typically, the NPN vertical power transistor described above has, in plan view, a so-called interdigitated geometry, i.e. one formed by an emitter region which spreads out in the shape of a comb with elongate portions, or fingers, inside the region defined by the metal base contacts 135.

Formed in the epitaxial layer 110 are two more regions 210 and 220 doped with P type impurities which constitute, respectively, the emitter and collector regions of a PNP lateral power transistor. The base region of this PNP lateral power transistor is contained within the N type epitaxial layer 110 and is therefore in common with the collector region of the NPN vertical power transistor.

On the front surface of the chip 200 lie two more metal tracks in contact with surface zones of the said chip; in particular, a metal track 230 is in contact with the emitter region 210 of the PNP lateral transistor and a track 240 is in contact with the collector region 220 of the same in order to form, respectively, the emitter electrode (E1) and collector electrode (C1) of the PNP lateral power transistor.

Preferably, this PNP lateral power transistor also has, in plan view, an interdigitated geometry; in particular, both the emitter region and collector region spread out in the shape of a comb with complementary elongate portions separated from one another by the base region.

Figure 2B:
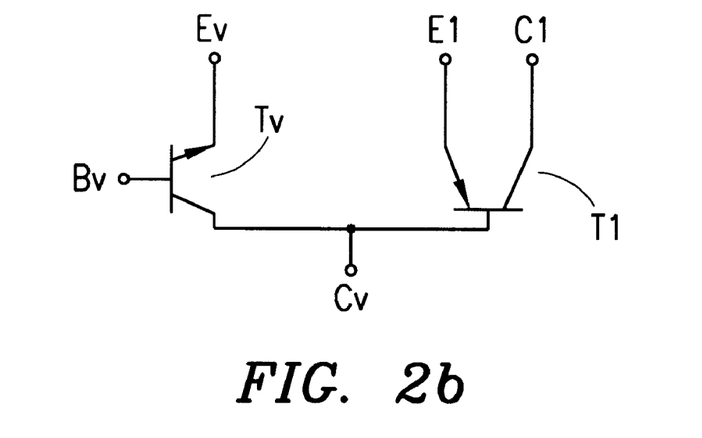

The equivalent circuit for the structure of FIG. 2a (confined to the power region alone) is shown in FIG. 2b. The circuit illustrated comprises an NPN vertical power transistor Tv, consisting of the N type region 125 (emitter), the P type region 120 (base) and the N type epitaxial layer 110 (collector) and a PNP lateral power transistor T1, consisting of the P type region 210 (emitter), the N type epitaxial layer 110 (base) and the P type region 220 (collector). As illustrated in the Figure, the collector of the vertical transistor Tv is connected to the base of the lateral transistor T1 (common epitaxial layer 110).

Figure 3:
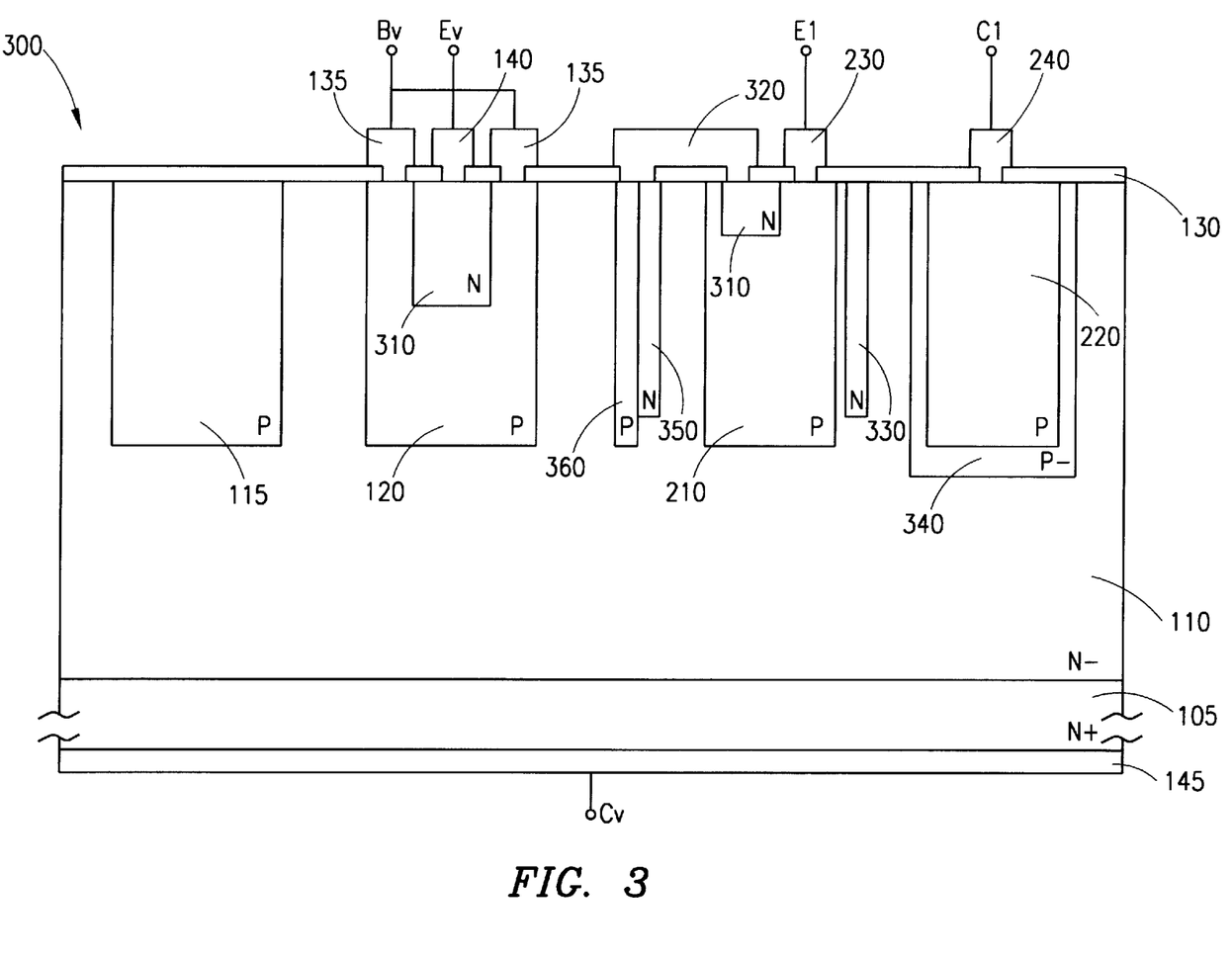
FIG. 3 shows in diagrammatic form another embodiment of the present invention.

With reference now to FIG. 3, there is described another embodiment of the present invention (the elements common to the structure illustrated in FIG. 2a are identified by the same reference numerals or symbols). In the power semiconductor structure 300 illustrated in the Figure there is a resistor consisting of the region 310 doped with N type impurities and made inside the P type region 210. The region 310 is connected, by means of a surface metal track 320, to the epitaxial layer 110 (via an N type region 350). The resistor made by the region 310 is therefore connected between the emitter of the lateral transistor T1 (region 210) and the base thereof (epitaxial layer 110). This so-called pull-up resistor is useful in the phase of turning off the PNP lateral power transistor; in fact it increases recombination of the charge accumulated in the base zone during the conduction phase, thereby reducing the recovery time of the device and speeding up the device switch-off phase. Note that the N typo region used to create this resistor does not activate any stray component in the integrated circuit. In fact, the NPN stray transistor created by the N type region 310, by the P type region 210 and by the epitaxial layer 110, has its emitter and collector regions mutually short-circuited through the surface metal track 320.

The circuit illustrated in the Figure comprises an N type region 330 made in the base region of the lateral transistor T1 (i.e. in the epitaxial layer 110) in proximity to the emitter region 210 thereof; this region 330 further enriches the base region with N type impurities (N− epitaxial layer) of the lateral transistor T1. The higher doping level of the base region reduces the extent of the depletion zone within the latter, therefore making it possible to avoid the phenomenon of punch-through to the emitter of the lateral power transistor. In particular, the phenomenon of punch-through, avoided at the surface of the enriched region 330, occurs across the deep base region. Note that, by increasing the doping of the base region of the lateral transistor T1, its gain is reduced; in the structure in accordance with the present invention such a limitation is not however critical insofar as the overall gain of the structure is given by the product of the gains of the NPN vertical transistor and of the PNP lateral transistor.

The voltage rating of the lateral transistor may however be limited by premature breakdown due to the reach-through phenomenon. Once the depletion region between base and collector has in fact attained its maximum dimension, the electric field generated in this junction increases rapidly with the increase in applied voltage; too high an electric field strength may cause breakdown of the base-collector junction. The reach-through phenomenon depends on the level of doping of the base and of the collector and on the width of the base region. The phenomenon of premature breakdown due to reach-through is successfully avoided and the punch-through breakdown value is successfully increased, attaining breakdown values greater than 200 V, by suitably dimensioning the device.

The circuit illustrated in the Figure therefore comprises a region 340 with a low concentration of P type impurities (P−) made in the epitaxial layer 110 and embracing the collector region 220 of the lateral transistor T1. This region 340 defines a collector zone for the transistor T1 with high resistivity, increasing its voltage rating.

Note that between the two NPN and PNP power transistors a stray component is created; in particular, this is a PNP lateral transistor created by the P type region 120 (collector), by the N epitaxial layer 110 (base) and by the P type region 210 (emitter). This component diverts current from the load connected to the transistor T1 and sends it to the base of the transistor Tv. The effects of this stray transistor can be reduced or eliminated by various techniques.

A first solution consists in increasing the doping of the base of the stray transistor, i.e. the epitaxial layer lying between the two regions 120 and 210, by introducing a region 350 with high N type doping; in this way the gain of the PNP lateral stray transistor is reduced as therefore is the current diverted from the load of the transistor T1.

A second solution consists in inserting into the epitaxial layer 110 a further P type region 360 in contact with the N type region 350. This region 360 makes it possible to split the stray component lying between the two regions 120 and 210 into two PNP lateral stray transistors, the first created by the P type region 120 (collector), by the N epitaxial layer 110 (base) and by the P type region 360 (emitter), and the second created by the P type region 360 (collector), by the epitaxial layer 110 (base) and by the P type region 210 (emitter). The metal track 320 connects the P type region 360 to the epitaxial layer 110, across the N type region 350 (used to avoid the formation of a P-N junction between the epitaxial layer and the metal contact, generally aluminium, containing P type impurities). The emitter of the first stray transistor (P type region 360) is therefore short-circuited over its own base (epitaxial layer 110) through the metal track 320; it is therefore permanently off, so that the current diverted from the load connected to the transistor T1 vanishes completely. Typically, the two regions 350 and 360 have, in plan view, the shape of a strip which separates-the NPN vertical power transistor from the PNP lateral power transistor.

Figure 4A:
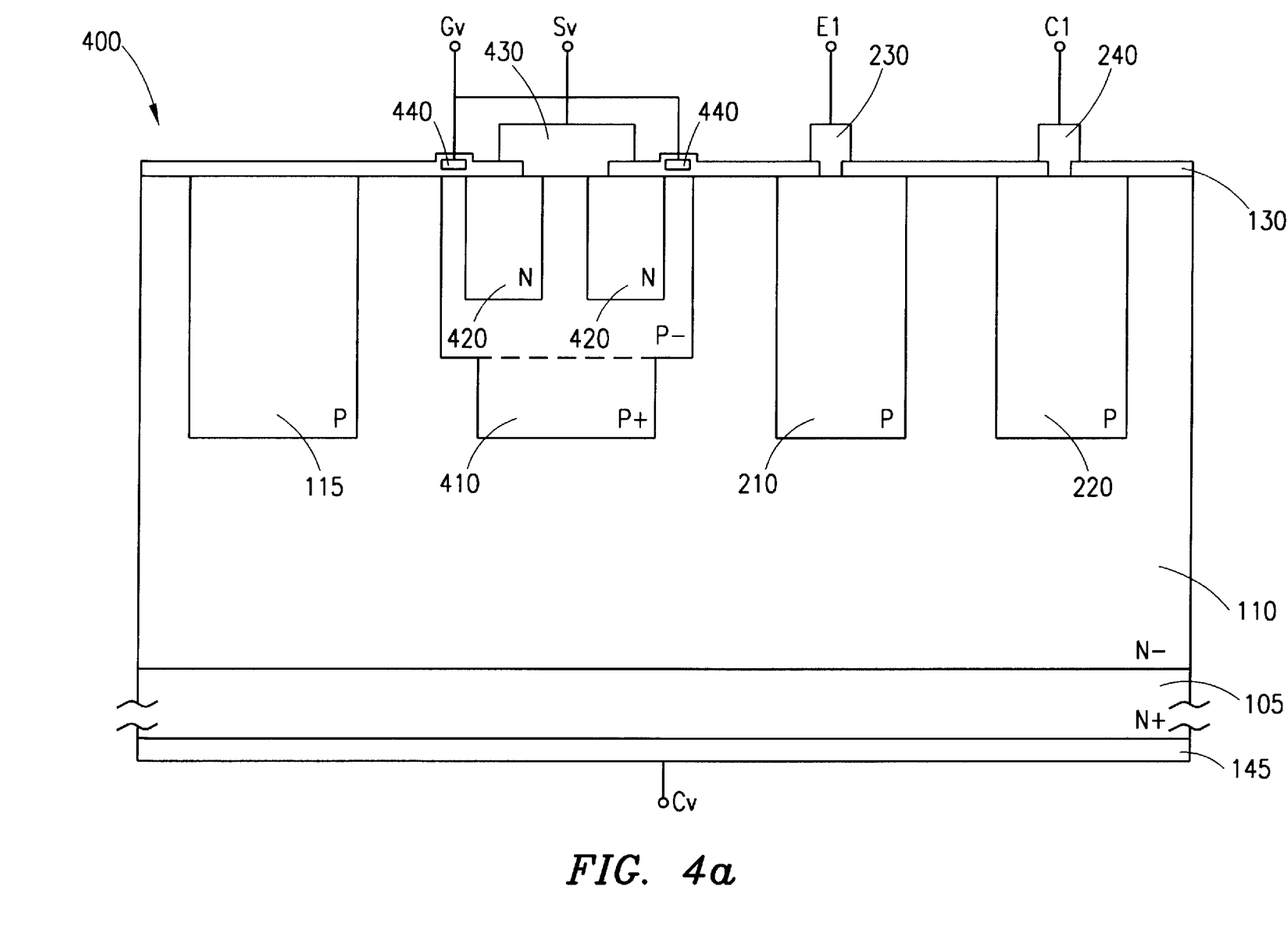
FIG. 4a illustrates in diagrammatic form a different embodiment of the power semiconductor structure in accordance with the present invention.

A different embodiment of the power semiconductor structure in accordance with the present invention is illustrated in FIG. 4a. The Figure illustrates, in similar fashion to that described earlier, a chip of semiconductor material 400 comprising a substrate 105 of type N+ and an epitaxial layer 110 of type N−, in which there is a P type insulation region 115 for the N type wells containing the control circuitry (which is not shown in the Figure).

The power semiconductor structure illustrated in the Figure comprises a vertically conducting field-effect power transistor (MOS). In particular, in the epitaxial layer 110 there is a P type region 410 which constitutes the "body" region of the field-effect transistor; typically, as illustrated in the Figure, this consists of a first region with low impurity concentration (P−) and of a second region ("deep-body") with high impurity concentration (P+). Inside the body region 410 is made a region with a high percentage of impurity of type N (N+) 420 which constitutes the source region of the field-effect transistor.

On the front surface of the chip 400, coated with the insulating layer 130, there is a metal track 430 which places the source region 420 in surface contact with the body region 410 and forms the source electrode (Sv) of the vertical field-effect transistor. On the same front surface, in proximity to the body region 410 in which the channel of the vertical MOS is formed, is made a layer of polycrystalline silicon 440 which is insulated from the surface of the chip by a thin layer of dielectric material and which constitutes the gate electrode (Gv) of the field-effect transistor. On the bottom of the chip 100 is the metal layer 145 which constitutes the drain electrode (Dv) of the said vertical power MOS.

In similar fashion to the previous case, in the epitaxial layer 110 there are two P type regions 210 and 220 which constitute, respectively, the emitter and collector regions of the PNP lateral power transistor; on the front surface lie two metal tracks 230 and 240 which form, respectively, the emitter electrode (E1) and collector electrode (C1) of the PNP lateral power transistor.

A person skilled in the art will appreciate that the same solutions described with reference to FIG. 3 can be applied in similar manner to the structure described above.

Figure 4B:
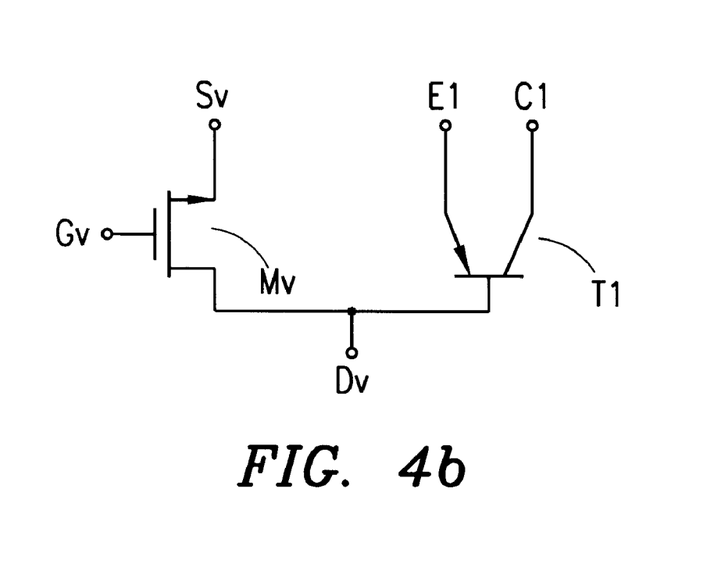

The equivalent circuit for the structure of FIG. 4a (restricted to the power region alone) is illustrated in FIG. 4b. The circuit illustrated comprises a vertical field-effect power transistor Mv, consisting of the N type region 420 (source) and of the N type epitaxial layer 110 (drain); in the body region 410 is formed the channel of the field-effect transistor, capacitively coupled to the gate electrode (Gv). The circuit shown therefore comprises the PNP lateral power transistor T1, consisting of the P type region 210 (emitter), the N type epitaxial layer 110 (base) and the P type region 220 (collector). As illustrated in the Figure, the drain of the field-effect transistor Mv is connected to the base of the lateral transistor T1 (common epitaxial layer 110).

Figure 5:
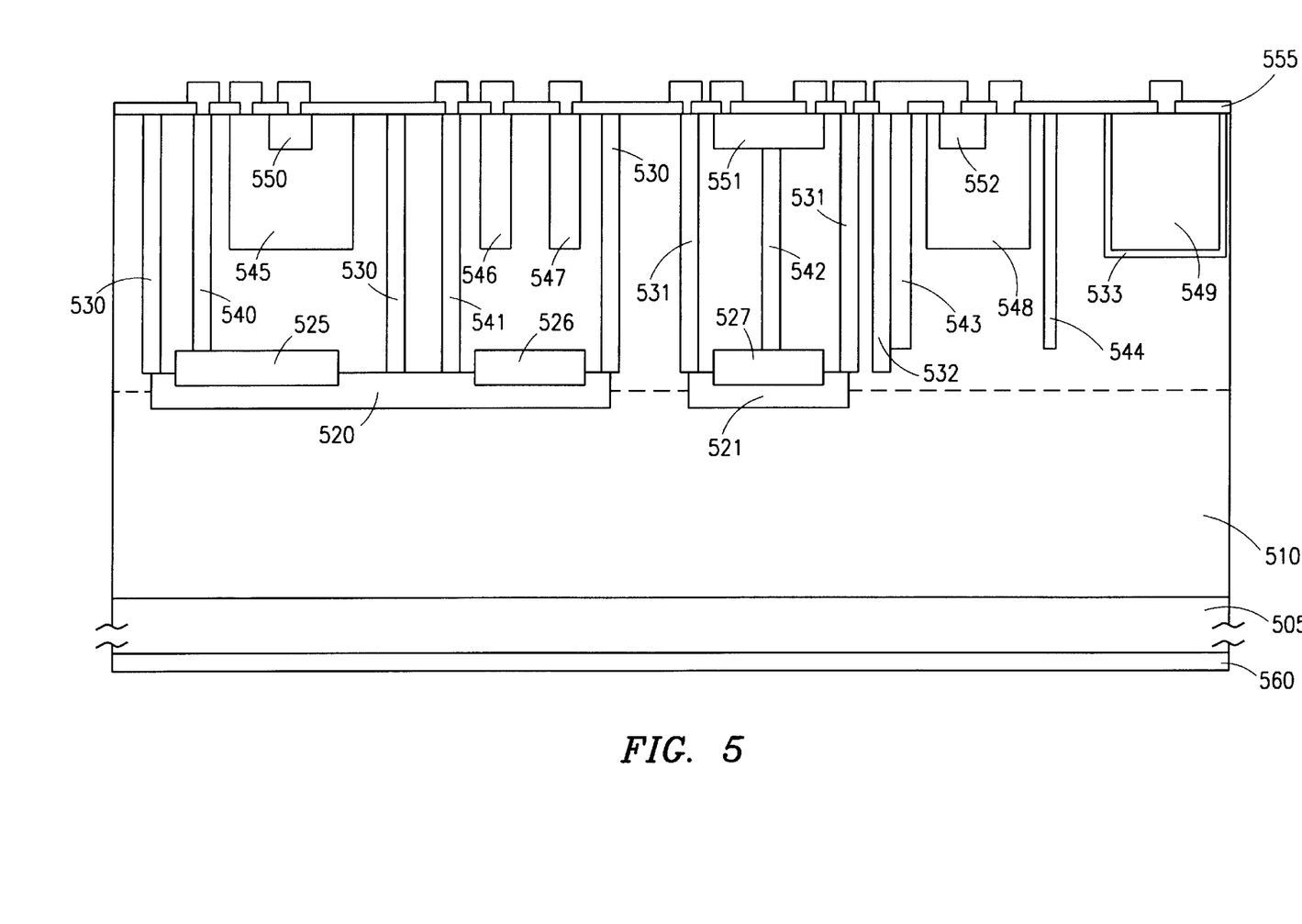
FIG. 5 illustrates a preferred embodiment of the present invention.

With reference now to FIG. 5, there is illustrated a preferred embodiment of the present invention, made using the VIPower process (VIPower is a trade mark of SGS-THOMSON MICROELECTRONICS S.r.l.).

In the VIPower process the chip of semiconductor material consists of a semiconductor substrate of a first conductivity type on which is formed an epitaxial layer doped with the same type of impurity. The power transistors (bipolar or field-effect) are constructed with a totally vertically conducting structure in which the various P-N junctions are buried in the epitaxial layer; the collector electrode or drain electrode is made on the back of the chip, i.e. on the opposite face of the substrate from that with the epitaxial layer. The control circuitry is on the other hand made inside one or more wells insulated by means of regions of a second conductivity type formed in the epitaxial layer. Note that different power devices can be made in the same chip of semiconductor material; in such a case, since the collector or the drain of the power transistors consists of the same metal layer present on the back of the chip, such power devices have their collector or drain region in common. Such a process of construction is described in European Patent Application EP-322040 on behalf of SGS-THOMSON MICROELECTRONICS S.r.l.

With reference to the structure illustrated in the Figure, on a substrate 505 of monocrystalline silicon strongly doped with impurities of type N (N+), is formed, by epitaxial growth, a first epitaxial layer 510 of the same conductivity type N but with low impurity concentration (N−).

P type regions having an impurity concentration of intermediate value (P) are formed by implantation and diffusion on the surface of the epitaxial layer 510; regions with N type doping are then made on these P type regions with a subsequent phase of implantation and diffusion. A second epitaxial layer 515 of type N having an impurity concentration greater than that of the first layer 510 is formed thereon by epitaxial growth.

In this phase, which is carried out at high temperature, the P type and N type implanted regions described above are extended further by diffusion into the two epitaxial layers giving rise to buried regions. In particular, the P type region 520 produces a buried insulation region for an N type well inside which the signal components will be integrated, while the P type region 521 constitutes a buried base region of the NPN vertical power transistor. The N type regions 525 and 526 are intended to constitute various components of the control circuitry; in the example shown in the Figure, the N type region 525 produces a buried collector region of an NPN vertical control transistor and the N type region 526 produces a buried base region of a PNP lateral control transistor. The N type region 527 on the other hand produces a buried emitter region of the NPN vertical power transistor.

At this point a phase of implanting and diffusing N type dopant is performed in the regions of the second epitaxial layer 515 which overlay the P type region 520, in order to enrich the surface regions for the purpose of preventing the punch-through of the components of the control circuitry to the insulation regions.

P type regions having high impurity concentration and crossing the whole of the second epitaxial layer 515 are then formed, with known techniques of masking and diffusion, in this second epitaxial layer 515. In particular, the P type regions 530 are joined up with the P type buried region 520 in order to complete the insulation region of the N type well containing the control circuitry. The P type regions 531 are joined up with the buried base region 521 and constitute deep base contact regions of the NPN vertical power transistor. The P type region 532 on the other hand produces part of the element interposed between the NPN vertical power transistor and the PNP lateral power transistor in order to reduce the effects of the stray components. This phase is also used to implant the region with low concentration of P type impurities 533 which serves to define the high resistivity collector zone for the lateral power transistor.

N type regions with high impurity concentration which are extended into the second epitaxial layer 515 are then formed with similar techniques of implantation (or alternatively with a deposition process) and of diffusion. In particular, the N type region 540 is extended up to the corresponding buried collector region 525 in order to produce a deep collector contact of the NPN vertical signal transistor, while the N type region 541 is extended up to the corresponding buried base region 526 in order to produce a deep base contact of the PNP lateral signal transistor. The N type region 542 is extended up to the corresponding buried emitter region 527 of the NPN vertical power transistor. The N type region 543 completes the element interposed between the NPN vertical power transistor and the PNP lateral power transistor. The N type region 544 serves on the other hand to avoid the phenomenon of punch-through to the emitter of the lateral power transistor.

There is then provision, with similar techniques, for implanting and diffusing P type regions. The P type region 545 defines the base region of the NPN vertical signal transistor, and the P type regions 546 and 547 define respectively the collector and emitter regions of the PNP lateral signal transistor. This phase is also used to define the resistors of the control region (which are not shown in the Figure). Furthermore, this makes it possible to produce the P type zones 548 and 549 which respectively define the emitter and collector regions of the PNP lateral power transistor.

Finally, by implantation and diffusion, further high-concentration N type regions are produced. In particular, the N type region 550 defines the emitter region of the NPN vertical signal transistor. The N type region 551 constitutes a region of connection between the emitter region of the NPN vertical power transistor and the front surface of the chip. The N type region 552, made inside the region 548, constitutes the pull-up resistor of the PNP lateral power transistor. This phase can also be used, as an alternative to that indicated above, to make the element 543 and the enriched region 544.

Subsequently, metal tracks which are in contact with surface zones of the various components are formed, with known techniques of deposition, masking and etching, on the front surface of the chip, which is coated with a silicon dioxide layer, labelled 555.

On the bottom of the chip, i.e. on the free surface of the substrate 505, is formed a metal layer 560 which constitutes the collector terminal of the NPN vertical power transistor.

Those skilled in the art will appreciate that the power semiconductor structure in accordance with the preferred embodiment of the present invention described above can be made with a standard fabrication process, without requiring additional phases; its fabrication is therefore easily achievable using the normal production processes and is economically advantageous.

What is claimed is:

1. A power semiconductor structure formed from a piece of N-type semiconductor material having first and second mutually opposing surfaces, said power semiconductor structure comprising:
   a vertical power transistor having a charge gathering region in said N-type semiconductor material and a charge gathering electrode consisting of conductive means on said first surface in contact with said N-type semiconductor material; and
   a PNP bipolar lateral power transistor having an emitter region and a collector region consisting, respectively, of a first and of a second P-type region extending from said second surface into said N-type semiconductor material and having a base region in said N-type semiconductor material substantially in common with said charge gathering region.

2. The power semiconductor structure according to claim 1, further comprising at least one well delimited by a P-type insulation region extending from said second surface to the inside of said N-type semiconductor material in order to contain control circuitry.

3. The power semiconductor structure according to claim 2, wherein said vertical power transistor is a bipolar transistor, said charge gathering region is a collector region, and said charge gathering electrode is a collector electrode, said bipolar transistor comprising:
   a base region consisting of a fifth P-type region extending from said second surface into said N-type semiconductor material and an emitter region consisting of a sixth N-type region extending from said second surface into said fifth P-type region; and
   a base electrode and an emitter electrode consisting of conductive means on said second surface in contact, respectively, with said fifth P-type region and with said sixth N-type region.

4. The power semiconductor structure according to claim 3, wherein:

the base region of said bipolar vertical transistor comprises a first P-type buried layer forming a first buried junction with said N-type semiconductor material and a first P-type contact region extending from said second surface to contact said first buried layer; and the emitter region of said bipolar vertical transistor comprising a second N-type buried layer forming a second buried junction with said first buried layer and a second N-type contact region extending from said second surface to contact said second buried region.

5. The power semiconductor structure according to claim 1, wherein said vertical power transistor is a field-effect transistor, said charge gathering region is a drain region, and said charge gathering electrode is a drain electrode, said field-effect transistor comprising:

a body region consisting of a third P-type region extending from said second surface into said N-type semiconductor material and a source region consisting of a fourth N-type region extending from said second surface into said third P-type region;

a source electrode consisting of conductive means on said second surface in contact with said fourth N-type region; and a gate electrode consisting of conductive means on said second surface and insulated from said third P-type region by a layer of dielectric material.

6. The power semiconductor structure according to claim 5, further comprising a resistor consisting of a seventh N-type region extending from said second surface into said first P-type region and conductive means on said second surface electrically connecting said seventh N-type region to said N-type semiconductor material.

7. The power semiconductor structure according to claim 5, further comprising an N-type enriched region extending from said second surface into a portion of said N-type material lying between said first and said second P-type region, said enriched region having a doping level greater than that of said N-type semiconductor material.

8. The power semiconductor structure according to claim 5, further comprising an eighth P-type region extending from said second surface into said N-type semiconductor material, said eighth P-type region comprising said second P-type region and having a doping level less than that of said second P-type region.

9. The power semiconductor structure according to claim 5, further comprising means for reducing the effects of a stray lateral transistor formed between said vertical transistor and said lateral transistor.

10. The power semiconductor structure according to claim 5, wherein P-type regions are provided instead of said N-type regions and vice versa.

11. The power semiconductor structure according to claim 1, wherein said vertical power transistor is a bipolar transistor, said charge gathering region is a collector region, and said charge gathering electrode is a collector electrode, said bipolar transistor comprising:

a base region consisting of a fifth P-type region extending from said second surface into said N-type semiconductor material and an emitter region consisting of a sixth N-type region extending from said second surface into said fifth P-type region; and a base electrode and an emitter electrode consisting of conductive means on said second surface in contact, respectively, with said fifth P-type region and with said sixth N-type region.

12. The power semiconductor structure according to claim 11, wherein:

the base region of said bipolar vertical transistor comprises a first P-type buried layer forming a first buried junction with said N-type semiconductor material and a first P-type contact region extending from said second surface to contact said first buried layer; and the emitter region of said bipolar vertical transistor comprising a second N-type buried layer forming a second buried junction with said first buried layer and a second N-type contact region extending from said second surface to contact said second buried region.

13. The power semiconductor structure according to claim 1, further comprising a resistor consisting of a seventh N-type region extending from said second surface into said first P-type region and conductive means on said second surface electrically connecting said seventh N-type region to said N-type semiconductor material.

14. The power semiconductor structure according to claim 1, further comprising an N-type enriched region extending from said second surface into a portion of said N-type semiconductor material lying between said first and said second P-type region, said enriched region having a doping level greater than that of said N-type semiconductor material.

15. The power semiconductor structure according to claim 1, further comprising an eighth P-type region extending from said second surface into said N-type semiconductor material, said eighth P-type region comprising said second P-type region and having a doping level less than that of said second P-type region.

16. The power semiconductor structure according to claim 1, further comprising means for reducing the effects of a stray lateral transistor formed between said vertical transistor and said lateral transistor.

17. The power semiconductor structure according to claim 1, wherein P-type regions are provided instead of said N-type regions and vice versa.

* * * * *